Feb. 6, 1962 J. R. DE MIRANDA ET AL 3,020,488

CONTROL ARRANGEMENT AND CIRCUIT ELEMENT
FOR ELECTRICAL AMPLIFIERS
Filed Nov. 25, 1958

INVENTORS
JACOBUS RODRIQUES DE MIRANDA
CORNELIS MARIA BOON
JAN HUBERT MARIA DELIEGE
BY
Frank R. Jifari
AGENT United States Patent Office 3,020,488

Patented Feb. 6, 1962

3,020,488

CONTROL ARRANGEMENT AND CIRCUIT ELEMENT FOR ELECTRICAL AMPLIFIERS

Jacobus Rodrigues de Miranda, Cornelis Maria Boon, and Jan Hubert Maria Deliege, all of Eindhoven, Netherlands, assignors to North American Philips Company, Inc., New York, N.Y., a corporation of Delaware Filed Nov. 25, 1958, Ser. No. 776,348
Claims priority, application Germany Nov. 26, 1957
1 Claim. (Cl. 330—59)

This invention relates to a control arrangement for a circuit element in electric amplifiers, for example, for automatic gain control in an electric amplifier. For this purpose usually a control voltage which is proportional to the output voltage is produced and supplied to an amplifier; the mutual conductance of the amplifier is varied by the control voltage.

The present invention is characterized in that there is connected in the transmission channel of the amplifier a photosensitive semiconductor resistor; the value of the resistor is controlled by a light source, which thus controls the amplification of the transmitted signal.

Figure 1:
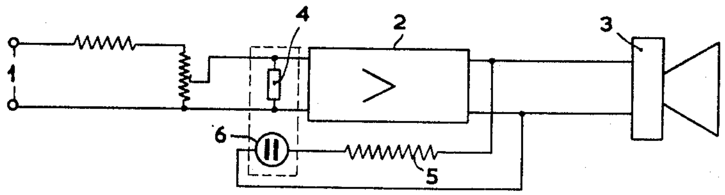
Figure 2:
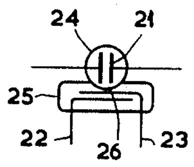
Figure 3:
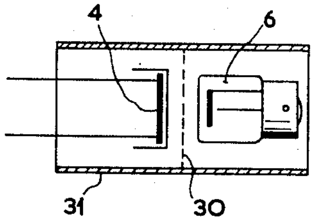

In order that the invention may readily be carried out, one embodiment thereof will now be described, by way of example, with reference to the accompanying drawings, in which, FIG. 1 is a schematic diagram of an amplifier provided with automatic volume control and FIGURES 2 and 3 show control elements in accordance with the invention.

In FIG. 1 the signal to be amplified is supplied to terminals 1 of an amplifier 2, the output of which is connected to a loudspeaker 3. According to the invention, in order to provide automatic gain control, a photosensitive resistor 4, for example a cadmium sulfide semiconductor resistor, is connected in the transmission channel between the input terminals 1 and the input circuit of the amplifier 2. The output of the amplifier 2 is connected through a resistor 5 to a light source 6, for example a gas discharge tube.

When the incoming signal becomes so large that the amplifier 2 is likely to be overdriven, the gas discharge tube 6 ignites and reduces the resistance value of the photoresistor 4. Thus the incoming signal is attenuated and overdriving is prevented.

Control arrangements for automatic gain control of an amplifier based on the principle of a light-controlled photoelectric cell are known in the art. However, these cells have a limitation in that the speed of the produced control is the same for increases and reductions in amplitude. Generally, however, it is desirable for increasing signals to be controlled at a much higher speed than decreasing signals. It has been found that a light-controlled semiconductor resistor satisfies these requirements. The free charge carriers which are produced in the semi-conductor resistor by the light source and which reduce the resistance value are produced very rapidly, for example within one tenth of a millisecond; however, if the light subsequently suddenly disappears, these free charge carriers persist during the recombination period, for example for 1 second.

Thus the circuit arrangement in accordance with the invention provides the advantage that adjustment is effected at a much higher speed than re-adjustment and no additional steps need be taken to ensure this advantageous effect. Furthermore the gas discharge tube 6, which may be for example a neon tube, has the advantages that it ignites rapidly and its characteristic has a steep control slope.

It has furthermore been found to be advantageous if the photoresistor and the light source are united to form a single structural member; this can be done by fusing or cementing the glass envelopes of these members to one another, as is shown in FIG. 2. In this figure reference numeral 21 denotes the light source and reference numerals 22 and 23 denote the connecting electrodes of the photoresistor. The photosensitive material, for example cadmiumsulphide, is interposed between the said electrodes The glass envelopes of the two members are designated 24 and 25 and are fused to each other at 26.

The use of a gas discharge tube 6 has the advantages noted above but it also has a limitation in that the tube can be suddenly ignited and extinguished owing to the adjustment, so that by capacitive transfer a voltage pulse can be produced at the photosensitive resistor. In order to avoid such a voltage pulse, in the arrangement according to FIG. 3 there is interposed between the tube 6 and the resistor 4, which may be united to form an integral structure by fusing or cementing, an electrically conductive screen 30 which prevents this transfer but transmits the light from the gas discharge tube 6 to the photoresistor 4.

The screen 30 may be connected to a common cylindrical envelope 31 for the photoresistor 4 and the tube 6 and in the arrangement of FIG. 1 is earthed. It may be in the form of a grid, as is shown in FIG. 3, or of a thin, transparent metal coating on the glass wall, but alternatively it may transmit the light from the tube 6 to the resistor 4 by reflection. The envelope 31 may also provide a contribution to this reflection.

What is claimed is:

An automatic gain control arrangement for an amplifier for changing the gain of the amplifier relatively rapidly in one direction when the amplitude of the amplified signal exceeds a predetermined value and changing the gain relatively slowly in the opposite direction when said amplified signal amplitude is below said predetermined value, comprising a source of input signals to be amplified, a photosensitive semi-conductive resistor capable of storing free charge carriers and connected to said source, an amplifier having its input terminals connected to said resistor, a light-emitting gas discharge tube connected across the output terminals of said amplifier, said tube instantaneously igniting and illuminating said resistor and setting up free charge carriers therein when the voltage at said output terminals exceeds said predetermined value, whereby said resistor instantaneously exhibits an increased conductivity when the tube is ignited and slowly recovers its initial low conductivity after the tube is extinguished, the slow recovery being due to the recombination period of the free charge carriers, said resistor and said gas discharge tube being arranged in a common envelope, the resistor and the tube being separated by an electrically conductive screen, thereby preventing transfer of voltage pulses to the resistor on the sudden ignition or extinguishment of the tube.

References Cited in the file of this patent

UNITED STATES PATENTS

| | | |
|---|---|---|
| 1,690,224 | Gent | Nov. 6, 1928 |
| 1,843,288 | Lenard | Feb. 2, 1932 |
| 2,212,337 | Brewer | Aug. 20, 1940 |
| 2,572,108 | Chalhoub | Oct. 23, 1951 |
| 2,745,021 | Kurshan | May 8, 1956 |

FOREIGN PATENTS

| | | |
|---|---|---|
| 664,644 | Great Britain | Jan. 9, 1952 |